United States Patent
Zhou et al.

(10) Patent No.: US 10,644,166 B2
(45) Date of Patent: May 5, 2020

(54) METHOD FOR FORMING SEMICONDUCTOR STRUCTURE

(71) Applicant: UNITED MICROELECTRONICS CORP., Hsin-Chu (TW)

(72) Inventors: Zhibiao Zhou, Singapore (SG); Shao-Hui Wu, Singapore (SG); Chi-Fa Ku, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 75 days.

(21) Appl. No.: 16/131,014

(22) Filed: Sep. 13, 2018

(65) Prior Publication Data

US 2019/0027607 A1 Jan. 24, 2019

Related U.S. Application Data

(60) Continuation of application No. 15/447,081, filed on Mar. 1, 2017, now Pat. No. 10,103,273, which is a (Continued)

(30) Foreign Application Priority Data

Apr. 30, 2015 (CN) .......................... 2015 1 0216493

(51) Int. Cl.
*H01L 29/12* (2006.01)
*H01L 29/786* (2006.01)
(Continued)

(52) U.S. Cl.
CPC ...... *H01L 29/7869* (2013.01); *H01L 27/1218* (2013.01); *H01L 27/1225* (2013.01);
(Continued)

(58) Field of Classification Search
CPC ............ H01L 29/7869; H01L 27/1218; H01L 27/1225; H01L 29/045; H01L 29/0649; H01L 29/24; H01L 29/4908; H01L 29/4916; H01L 29/517; H01L 29/66969; H01L 29/78603
See application file for complete search history.

(56) References Cited

U.S. PATENT DOCUMENTS

2013/0020575 A1 1/2013 Ishizuka
2013/0161621 A1 6/2013 Isobe
(Continued)

FOREIGN PATENT DOCUMENTS

CN 1507064 A 6/2004
CN 1649171 A 8/2005
(Continued)

*Primary Examiner* — Victor A Mandala
*Assistant Examiner* — Colleen E Snow
(74) *Attorney, Agent, or Firm* — Winston Hsu

(57) ABSTRACT

The present invention provides a method for forming a semiconductor structure, the method includes: firstly, a substrate having a recess disposed therein is provided, wherein the substrate comprises a silicon substrate, next, a first element is formed in the recess and arranged along a first direction, wherein the first element is made of an oxidation semiconductor material, afterwards, a dielectric layer is formed on the first element, and a second element is formed on dielectric layer and arranged along the first direction, wherein the second element is used as the gate structure of a transistor structure.

17 Claims, 8 Drawing Sheets

Related U.S. Application Data division of application No. 14/724,799, filed on May 28, 2015, now Pat. No. 9,627,547.

(51) Int. Cl.
  *H01L 29/24* (2006.01)
  *H01L 29/04* (2006.01)
  *H01L 29/49* (2006.01)
  *H01L 29/51* (2006.01)
  *H01L 29/66* (2006.01)
  *H01L 27/12* (2006.01)
  *H01L 29/06* (2006.01)

(52) U.S. Cl.
  CPC ........ *H01L 29/045* (2013.01); *H01L 29/0649* (2013.01); *H01L 29/24* (2013.01); *H01L 29/4908* (2013.01); *H01L 29/4916* (2013.01); *H01L 29/517* (2013.01); *H01L 29/66969* (2013.01); *H01L 29/78603* (2013.01)

(56) References Cited

U.S. PATENT DOCUMENTS

| | | |
|---|---|---|
| 2013/0187161 A1 | 7/2013 | Yamazaki |
| 2014/0339548 A1 | 11/2014 | Yamazaki |
| 2015/0021603 A1 | 1/2015 | Isobe |

FOREIGN PATENT DOCUMENTS

| | | |
|---|---|---|
| CN | 1967842 A | 5/2007 |
| CN | 104347409 A | 2/2015 |

METHOD FOR FORMING SEMICONDUCTOR STRUCTURE

CROSS REFERENCE TO RELATED APPLICATIONS

This application is a continuation application of U.S. application Ser. No. 15/447,081, filed on Mar. 1, 2017, which is a divisional application of U.S. application Ser. No. 14/724,799, filed on May 28, 2015, now U.S. Pat. No. 9,627,547, issued on Apr. 18, 2017, and all benefits of such earlier applications are hereby claimed for this division application.

BACKGROUND OF THE INVENTION

1. Field of the Invention

The present invention relates generally to a method for forming semiconductor structure and, more particularly, to method for forming a semiconductor structure combined with IGZO (In—Ga—Zn Oxide) materials.

2. Description of the Prior Art

Attention has been focused on a technique for formation of a transistor using a semiconductor thin film formed over a substrate having an insulating surface. The transistor is used in a wide range of electronic devices such as an integrated circuit (IC) and an image display device (display device). A silicon-based semiconductor material is widely known as a material for a semiconductor thin film applicable to a transistor, and within which, oxide semiconductor containing indium (In), gallium (Ga), and zinc (Zn) has been attracting attention.

A transistor including an oxide semiconductor film is known to have an extremely low leakage current in an off state. Nevertheless, current architecture of integrating transistor having oxide semiconductor film with metal-oxide semiconductor (MOS) transistor is still insufficient in bringing out optical performance of the device. Hence, how to improve the current fabrication flow for integrating oxide semiconductor transistor with MOS transistor has become an important task in this field.

SUMMARY OF THE INVENTION

The present invention provides a method for forming a semiconductor structure, the method includes: firstly, a substrate having a recess disposed therein is provided, wherein the substrate comprises a silicon substrate, next, a first element is formed in the recess and arranged along a first direction, wherein the first element is made of an oxidation semiconductor material, afterwards, a dielectric layer is formed on the first element, and a second element is formed on dielectric layer and arranged along the first direction, wherein the second element is used as the gate structure of a transistor structure.

The present invention further provides a method for forming semiconductor structure, the method includes: firstly, a substrate having an isolation region disposed therein is provided, next, a first element is formed in the isolation region and arranged along a first direction, wherein the first element is made of an oxidation semiconductor material, afterwards, a dielectric layer is formed on the first element, wherein parts of the dielectric layer contacts the substrate directly, and a second element is formed on dielectric layer and arranged along a second direction, wherein the second element is used as the gate structure of a transistor structure.

The transistor structures of the present invention are combined with the oxidation semiconductor materials, especially with IGZO or CAAC-IGZO. Since IGZO or CAAC-IGZO have higher mobility than silicon, the leakage current of a transistor structure made of IGZO is extremely low when the transistor structure is under off state. In this way, the transistor structure has low power consumption advantage. In summary, the present invention uses the IGZO or CAAC-IGZO to replace the channel region of a transistor structure, thereby improving the performance of the transistor structure effectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
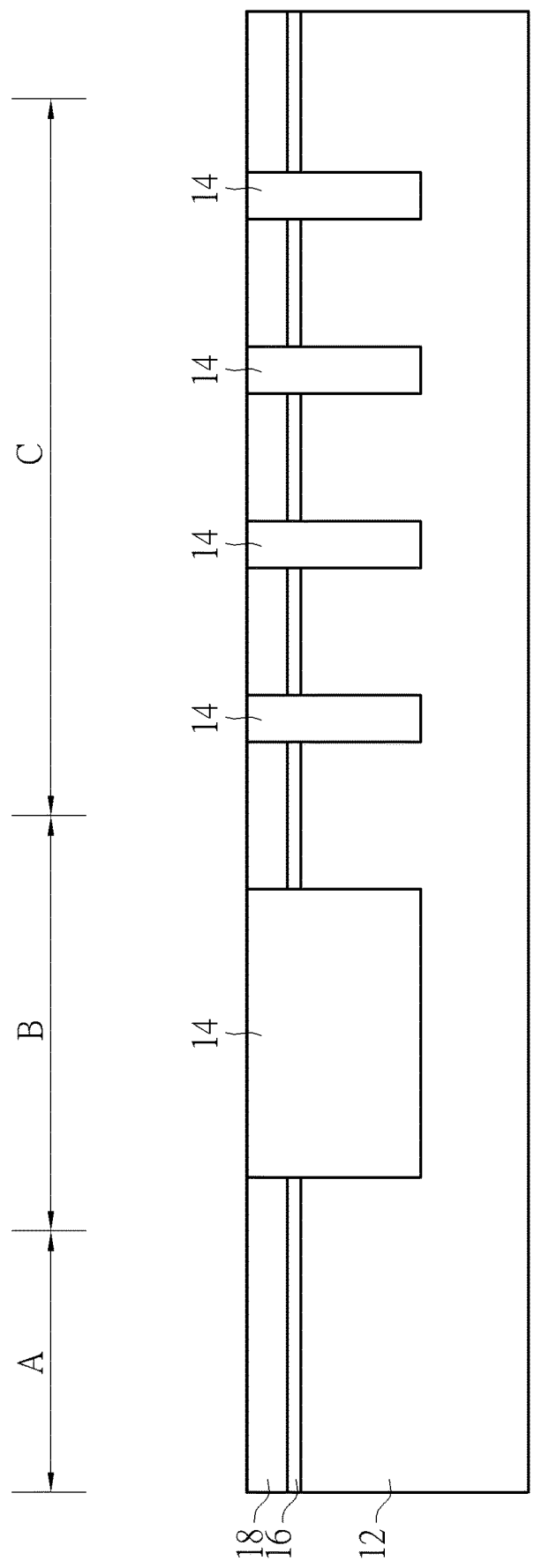
FIGS. 1-6 illustrate a method for fabricating a semiconductor structure according to a preferred embodiment of the present invention.

Please refer to FIGS. 1-6, FIGS. 1-6 illustrate a method for fabricating a semiconductor structure according to a preferred embodiment of the present invention. As shown in FIG. 1, a substrate 12 is provided, in which the substrate 12 could be a silicon substrate, epitaxial substrate, silicon carbide substrate, or silicon-on-insulator (SOI) substrate, but is not limited thereto. In this embodiment, a first region A, a second region B and a third region C are defined on the substrate 12, wherein the transistor structure according to the first preferred embodiment of the present invention will be formed within the first region A in the following steps; the transistor structure according to the second preferred embodiment of the present invention will be formed within the second region B in the following steps; and a conventional transistor structure will be formed within the third region C, used for comparing the transistor structures within the first region A or within the second region B.

It is noteworthy that in the paragraph above, the first region A, the second region B and the third region C are defined on the substrate simultaneously, however, the present invention does not need to comprise the first region A, the second region B and the third region C simultaneously. In other words, if a structure only comprises the transistor structure disposed within the first region A or only comprises the transistor structure disposed within the second region B, it should also be within the scope of the present invention. It will not be noted again in the following paragraphs.

According to an embodiment of the present invention, a plurality of doped wells (not shown) and/or isolation regions 14 could be formed in the substrate 12, the isolation region such as the shallow trench isolations (STI). Besides, a dielectric layer is preferably formed on the substrate 12, and the dielectric layer may be a single layer structure or a multiple layers structure. In this embodiment, the dielectric layer includes a silicon oxide layer 16 and a silicon nitride layer 18, but is not limited thereto, the material of the dielectric layer can be adjusted according to actual requirements. In addition, the dielectric layer may comprise the hard mask and the etching stop layer during the process for forming the isolation region 14.

Also, it should be noted that even though the fabrication process of this embodiment pertains to a planar type transistor, the fabrication process could also be applied to non-planar transistor such as FinFET, and in such instance, the element 12 shown in FIG. 1 would then become a fin-shaped structure on a substrate. In this case, the dielectric layer mentioned above can used as the hard mask for forming the fin-shaped structure and the etching stop layer for forming the isolation region 14.

Figure 2:
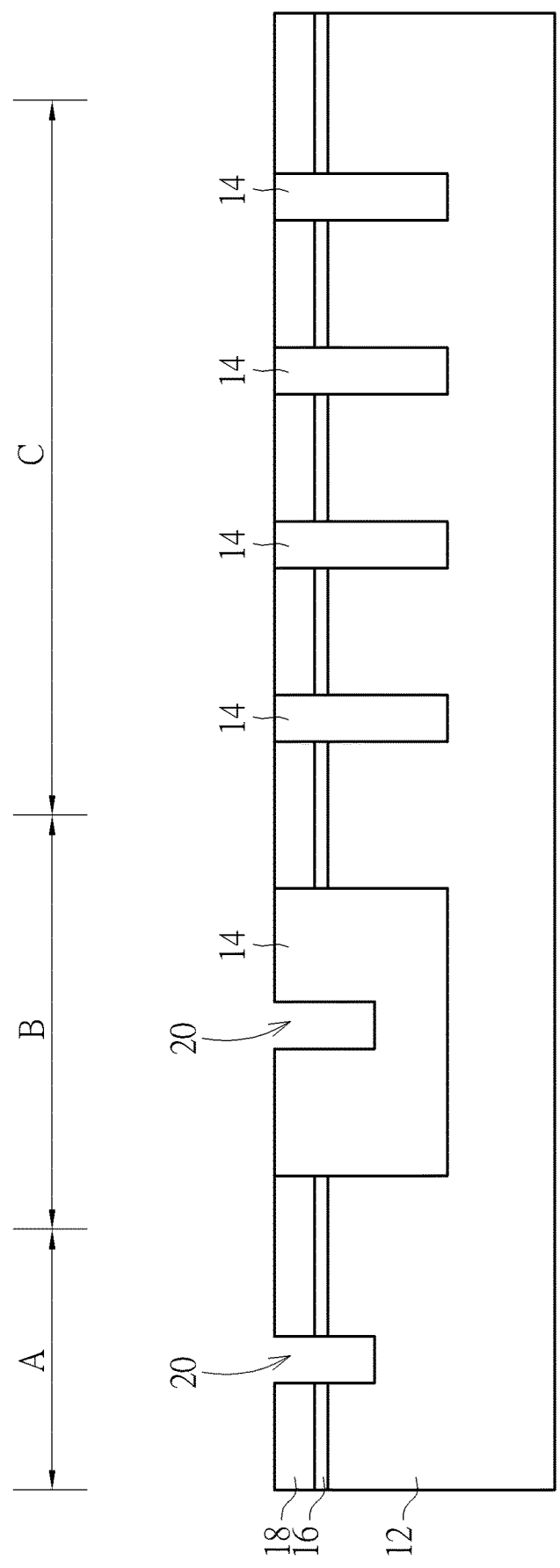

Next, as shown in FIG. 2, at least one recess 20 is formed in the substrate 12 within the first region A and within the isolation region 14 within the second region B respectively. The recess 20 can be formed through an etching process, but is not limited thereto.

Figure 3:
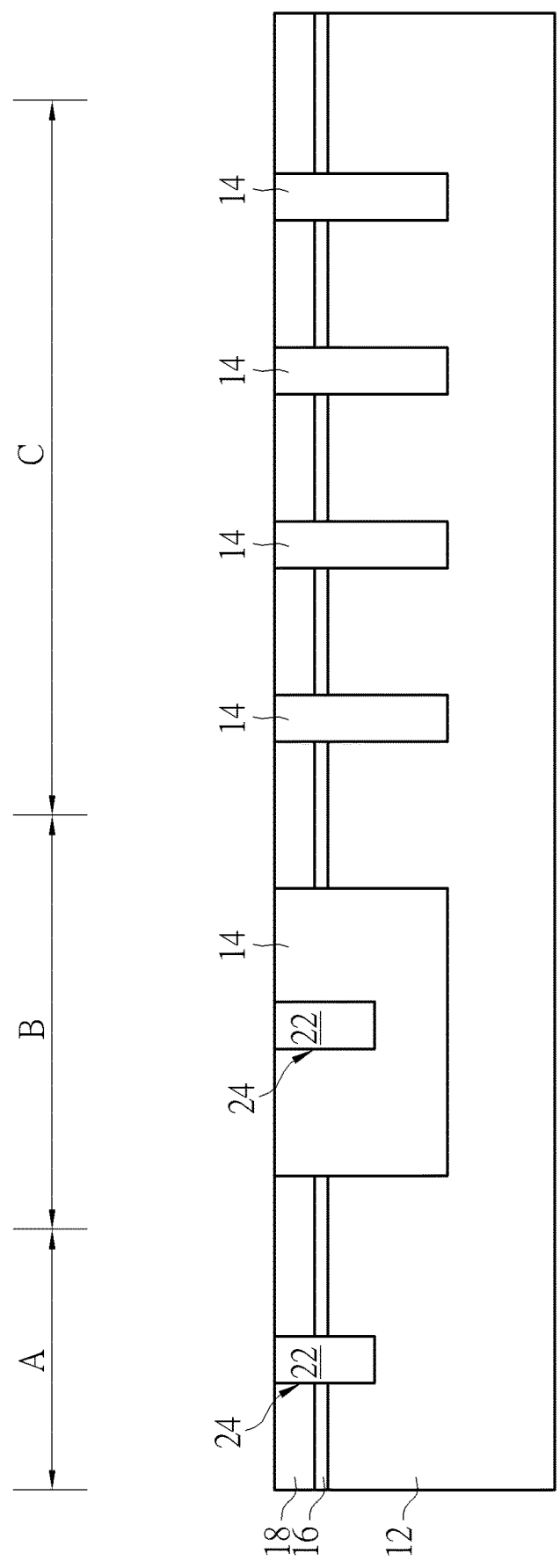

As shown in FIG. 3, an oxidation semiconductor material 22 is then filled in each recess 20 within the first region A and within the second region B. Each recess 20 is filled by the oxidation semiconductor material 22, so as to form a plurality of first elements 24. The oxidation semiconductor material mentioned above comprises In—Ga—Zn oxide (IGZO) or c-axis aligned crystal IGZO, (CAAC-IGZO). Next, a planarization process is performed, such as a chemical mechanical polishing (CMP) process, to remove the extra oxidation semiconductor material 22 on the dielectric layer (the silicon nitride layer 18), and to form a flat surface.

Figure 4:
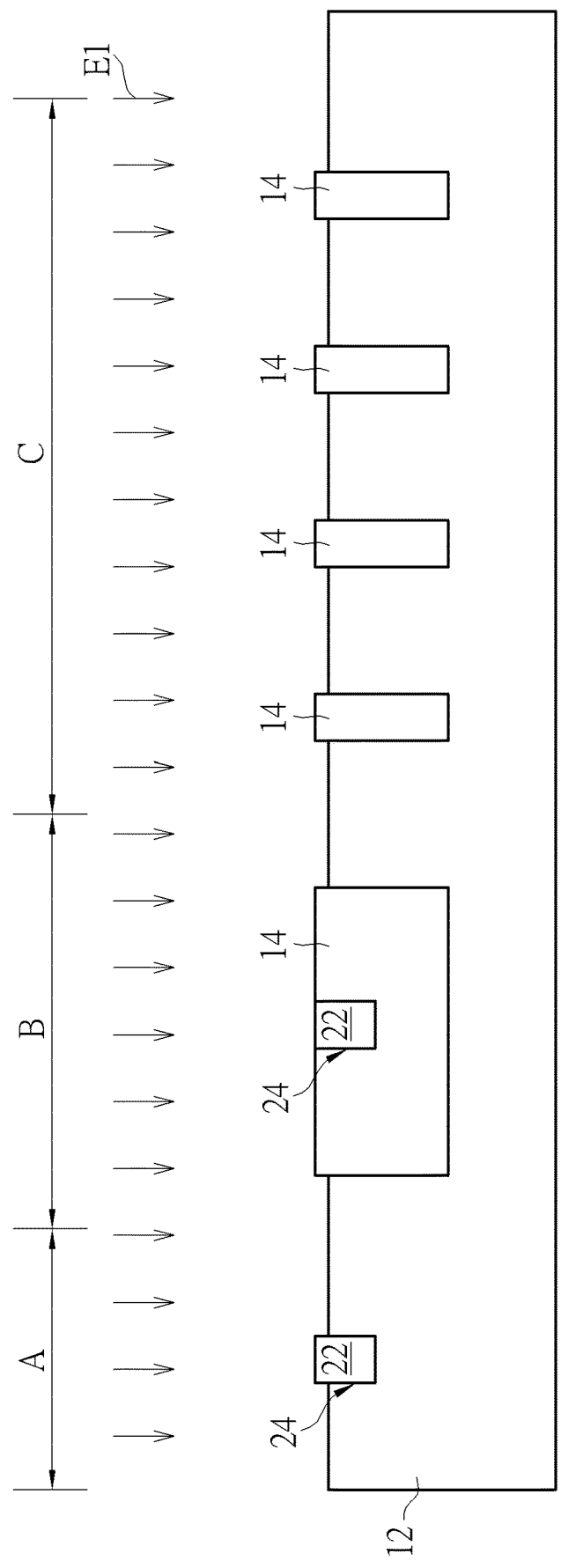
Figure 5:
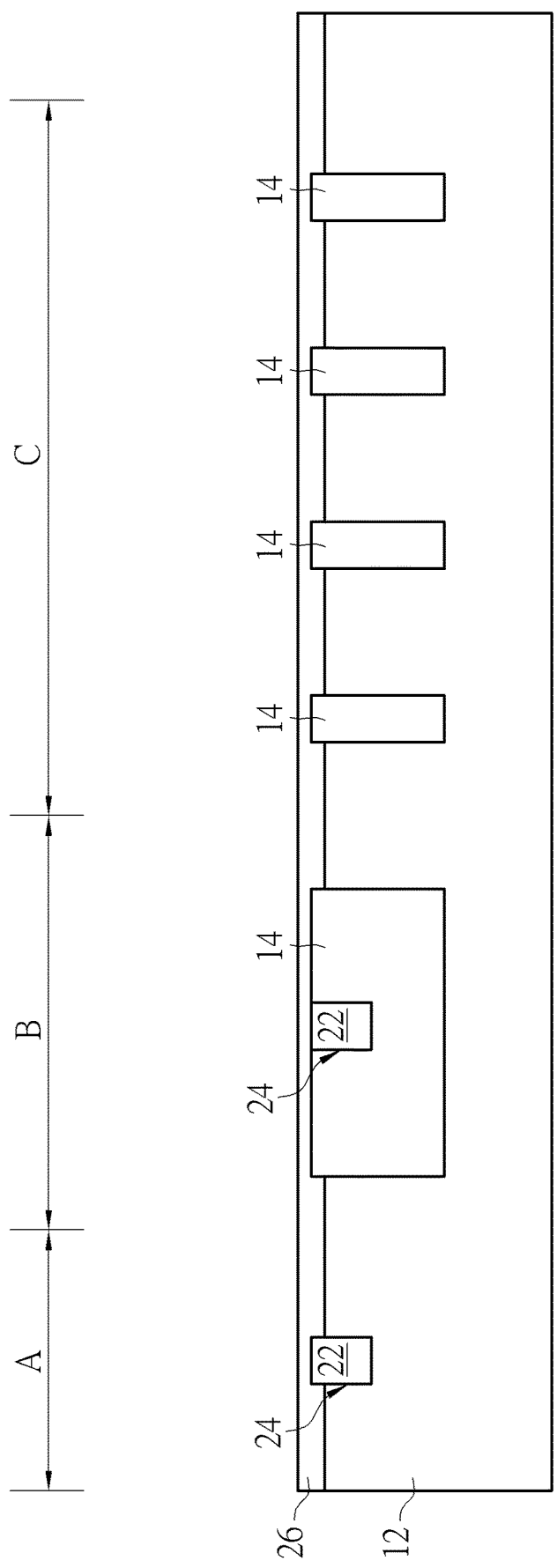

As shown in FIGS. 4-5, an etching back process E1 is performed, to remove the silicon oxide layer 16 and the silicon nitride layer 18. Preferably, the top surface of the substrate 12 is exposed, and at this time, the top surface of each first element 24 is higher than the top surface of the substrate 12. Afterwards, as shown in FIG. 5, an oxide layer 26 is then deposited on the substrate 12, and covering each first element 24. The oxide layer 26 such as aluminum oxide ($Al_2O_3$), gallium oxide ($Ga_2O_3$), and $HfO_2$, but is not limited thereto. The oxide layer 26 can protect the first element 24 disposed below, thereby avoiding the destruction of the first elements 24 in the following steps. Furthermore, the oxide layer 26 can be used as the gate dielectric layer of a transistor structure, in other words, used as the dielectric layer which separates the gate region and the channel region from each other.

Figure 6:
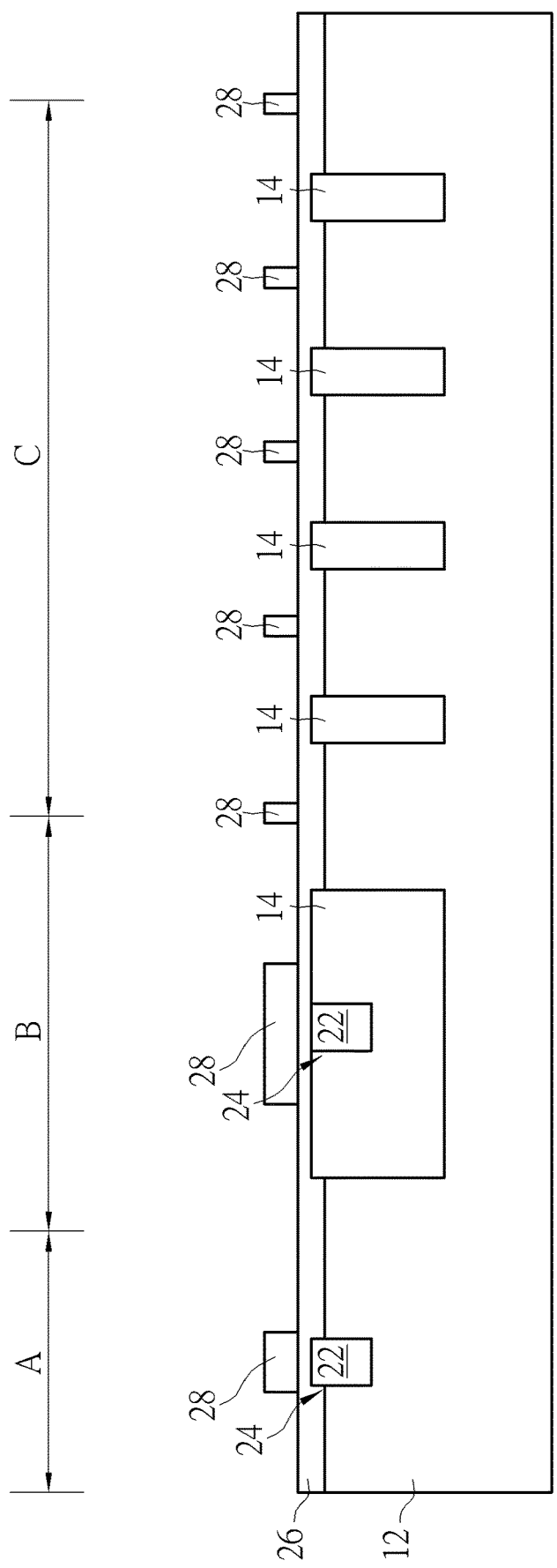

As shown in FIG. 6, a plurality of second elements 28 are formed within the first region A, the second region B and the third region C. More precisely, the second elements 28 are used as the gate structures of a transistor device, covering on the oxide layer 26, and the material of the second element 28 may include polysilicon or metals. In addition, the manufacturing process for forming the second element 28 may be formed through a gate first process, a gate last high-k first process, or a gate last high-k last process. Those processes mentioned above are well known to those skilled in the art, and will not be described in detail here.

Figure 6A:
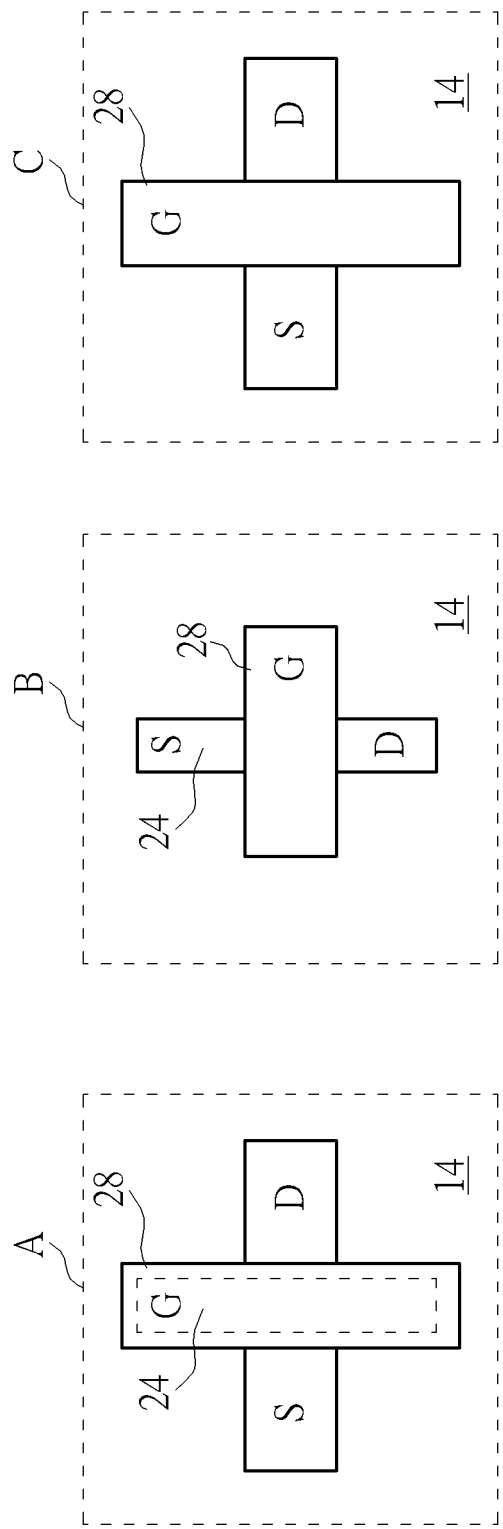
FIG. 6A shows the top view diagrams within the first region A, the second region B and parts of the third region C of FIG. 6.

In addition, FIG. 6A shows the top view diagrams within the first region A, the second region B and parts of the third region C of FIG. 6. As shown in FIG. 6, within the first region A, both the first element 24 and the second element 28 (gate structure) are arranged along a first direction (such as Y– axis). Preferably, the area of the second element 28 is larger than the area of the first element 24. Therefore, when viewed in a top view, the second element 28 totally covers the first element 24. And the source/drain (S/D) regions or the epitaxial layer (not shown) are formed in the substrate 12 disposed on two sides of the second element 28. It is noteworthy that when viewed in cross section views (such as FIGS. 1-6), even though the isolation region 14 is shown only within the second region B, and not shown within the first region A, actually as shown in FIG. 6A, the isolation region 14 is disposed in the substrate and surrounding outside of the source/drain region.

In the present invention, please refer to FIG. 6 and FIG. 6A, two different transistor structures are formed within the first region A and within the second region B respectively, and both of the transistor structures are combined with IGZO materials. In other words, both of them comprise the first element 24 made of IGZO or CAAC-IGZO, and the first element 24 at least disposed in the channel region of the transistor structure, namely disposed between the source region and the drain region. Take the transistor structure within the first region A (the first preferably embodiment of the present invention) as an example, the second element 28 is used as the gate structure, disposed on the oxide layer 26, and the source/drain regions are formed through implanting the substrate 12 disposed on two sides of the second element 28. In this embodiment, the first element 24 is disposed in the substrate 12, directly contacting the substrate 12, and disposed between the source region S and the drain region D, to be used as the channel region of the transistor structure. IGZO (or CAAC-IGZO) has higher mobility than silicon substrate does, thereby increasing the performance of the transistor structure. Afterwards, the transistor structure can be combined with some semiconductor manufacturing processes, such as forming the interlayer dielectric (ILD), performing the silicide layer, forming the contact plugs, etc. The processes mentioned above are well known to those skilled in the art, and will not be described in detail here.

Figure 7A:
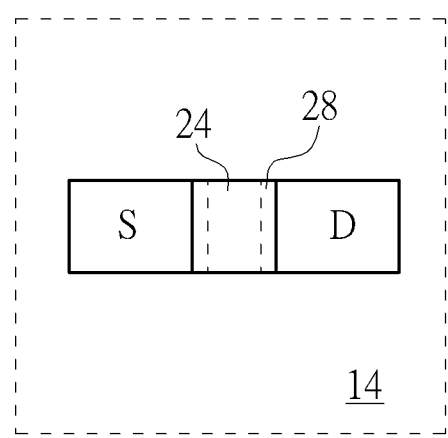
FIG. 7A shows the top view within the first region A according to another embodiment of the present invention.

In addition, FIG. 7A shows the top view within the first region A according to another embodiment of the present invention. The difference between this embodiment and the transistor structure shown in FIG. 6A is the first element 24 is only disposed between the source region S and the drain region D, and does not extend to the isolation region 14 surrounding outside. The structure should also be within the scope of the present invention. Others features of this embodiment are same as those described above, and will not be redundantly described here.

Please refer to FIG. 6A again, showing the transistor structure within the second region B (the second embodiment of the present invention). The difference between this transistor structure and the transistor structure of the first preferred embodiment is that in this embodiment, the isolation region 14 is disposed in the substrate 12, and the first element 24 is disposed in the isolation region 14, arranged along the first direction (such as Y-axis), and the second element 28 crosses over the first element 24, arranged along a second direction (such as X-axis). Preferably, the second element 28 and the first element 24 are arranged orthogonally. Besides, when viewed in cross section views (FIG. 6), the top surface of the isolation region 14 and the top surface of the first element 24 are on a same level, and the top surface of the first element 24 is higher than the top surface of the substrate 12. In this embodiment, the second element 28 is disposed on the oxide layer 26 and used as the gate structure of a transistor structure, and the first element 24 disposed on two sides of the second element 28 is then implanted, so as to form the source region S/drain region D. In addition, the first element 24 disposed right below the second element 28, namely the intersection of the second element 28 and the first element 24 is used as the channel region of the transistor structure.

Compared with conventional transistor structures, such as the transistor structure formed within the third region C, the transistor structures of the present invention combined with the oxidation semiconductor materials, especially with IGZO or CAAC-IGZO, has advantages. Since IGZO or CAAC-IGZO have higher mobility than silicon, and the leakage current of a transistor structure made of IGZO is extremely low when the transistor structure is under off state, the transistor structure has low power consumption. In summary, the present invention uses the IGZO or CAAC-IGZO to replace the channel region of a transistor structure, thereby improving the performance of the transistor structure effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:
   providing a substrate having a recess disposed therein, wherein the substrate comprises a silicon substrate;
   forming a first element in the recess and arranged along a first direction, wherein the first element is made of an oxidation semiconductor material;
   forming a dielectric layer disposed on the first element; and
   forming a second element disposed on dielectric layer and arranged along the first direction, wherein the second element is used as a gate structure of a transistor structure.

2. The method of claim 1, wherein the oxidation semiconductor material of the first element includes In—Ga—Zn oxide (IGZO).

3. The method of claim 2, wherein the IGZO further comprises c-axis aligned crystal IGZO (CAAC-IGZO).

4. The method of claim 1, wherein the material of the second element includes polysilicon.

5. The method of claim 1, wherein the first element directly contacts the substrate.

6. The method of claim 1, wherein a top surface of the first element is higher than a top surface of the substrate.

7. The method of claim 1, wherein the material of the dielectric layer includes aluminum oxide or gallium oxide.

8. The method of claim 1, wherein the second element entirely covers the region of the first element.

9. A method for forming a semiconductor structure, comprising:
   providing a substrate, having an isolation region disposed therein;
   forming a first element disposed in the isolation region and arranged along a first direction, wherein the first element is made of an oxidation semiconductor material;
   forming a dielectric layer disposed on the first element, wherein parts of the dielectric layer contacts the substrate directly; and
   forming a second element disposed on dielectric layer and arranged along a second direction, wherein the second element is used as a gate structure of a transistor structure.

10. The method of claim 9, wherein the oxidation semiconductor material of the first element includes In—Ga—Zn oxide (IGZO).

11. The method of claim 10, wherein the IGZO further comprises c-axis aligned crystal IGZO (CAAC-IGZO).

12. The method of claim 9, wherein the material of the second element includes polysilicon.

13. The method of claim 9, wherein a top surface of the first element is higher than a top surface of the substrate.

14. The method of claim 9, wherein the material of the dielectric layer includes aluminum oxide or gallium oxide.

15. The method of claim 9, wherein the second direction is perpendicular to the first direction.

16. The method of claim 9, wherein a top surface of the isolation region and a top surface of the first element are on a same level.

17. The method of claim 9, wherein parts of the first element are disposed between a source region and a drain region of the transistor structure.

* * * * *